(12) United States Patent
Fujikake

(10) Patent No.: US 7,446,889 B2
(45) Date of Patent: Nov. 4, 2008

(54) METHOD OF EVALUATING FILM THICKNESS, METHOD OF DETECTING POLISHING TERMINAL, AND DEVICE-MANUFACTURING APPARATUS

(75) Inventor: Shinji Fujikake, Nagano (JP)

(73) Assignee: Fuji Electric Holdings Co., Ltd., Kawasaki, Kanagawa (JP)

( * ) Notice: Subject to any disclaimer, the term of this patent is extended or adjusted under 35 U.S.C. 154(b) by 516 days.

(21) Appl. No.: 11/055,619

(22) Filed: Feb. 11, 2005

(65) Prior Publication Data

US 2005/0191859 A1 Sep. 1, 2005

(30) Foreign Application Priority Data

Feb. 27, 2004 (JP) .............................. 2004-053947

(51) Int. Cl.
*G01B 11/28* (2006.01)

(52) U.S. Cl. ..................................................... 356/630

(58) Field of Classification Search ....................... None
See application file for complete search history.

(56) References Cited

U.S. PATENT DOCUMENTS 6,580,508 B1 * 6/2003 Chen et al. .................. 356/445
2002/0127951 A1 * 9/2002 Ishikawa et al. ................ 451/6
2006/0166606 A1 * 7/2006 Kobayashi et al. ............. 451/6

FOREIGN PATENT DOCUMENTS

| JP | 2000-183001 | 6/2000 |
| JP | 2000-186917 | 7/2000 |
| JP | 2000-186918 | 7/2000 |

* cited by examiner

Primary Examiner—Michael P Stafira
(74) Attorney, Agent, or Firm—Manabu Kanesaka

(57) ABSTRACT

A method of evaluating a thickness of a film during a polishing process includes the steps of irradiating light onto a surface of the film during the polishing process; obtaining a differential signal of reflection spectra at a polishing time t and a polishing time t−Δt with a time difference Δt from the polishing time t; and analyzing the differential signal to obtain a thickness d of the film at the polishing time t.

10 Claims, 5 Drawing Sheets

METHOD OF EVALUATING FILM THICKNESS, METHOD OF DETECTING POLISHING TERMINAL, AND DEVICE-MANUFACTURING APPARATUS

BACKGROUND OF THE INVENTION AND RELATED ART STATEMENT

The present invention relates to a method of evaluating a film thickness, a method of detecting a polishing terminal, and a device-manufacturing apparatus. More particularly, the present invention relates to a method of evaluating a film thickness and a method of detecting a polishing terminal when an insulating film formed on a device is polished with a chemical mechanical polishing method. The present invention also relates to an apparatus for manufacturing a device while evaluating a film thickness.

In a process of manufacturing a semiconductor device, a chemical mechanical polishing (CMP) method has been widely used for polishing an insulating film and a metallic film formed on a wafer. In the CMP method, it is necessary to accurately evaluate an actual thickness of an insulating film or a metallic film during a polishing process and determine a point of terminating the polishing process (polishing terminal).

As a conventional method of detecting the polishing terminal of a light-permeable thin film such as an oxidized film or nitride film, for example, a method has been proposed in which a beam is irradiated onto a polished surface of a wafer, and a spectra intensity distribution of a reflective beam is measured to determine the polishing terminal (refer to Patent document 1). In the method, light from a light source is split into parallel beams via a lens and irradiated onto a polished surface of a wafer. A beam-shielding slit selects zero dimension (i.e., a regular reflection beam) beams reflected from the polished surface of the wafer, and the spectra intensity distribution is measured. The spectra intensity distribution is compared with spectra characteristics stored in advance to detect the polishing terminal.

As another method of detecting the polishing terminal of a light-permeable thin film, a method has been proposed in which a color component of a reflective beam is detected to determine the polishing terminal of a light-permeable thin film (refer to Patent document 2). In the method, light from a light source is guided via a light guide member and irradiated onto a polished surface of a wafer. The light guide guides light reflected from the polished surface to a color sensor for detecting a color component. The color component is compared with a reference color component stored in advance to determine the polishing terminal.

Patent Document 1: Japanese Patent Publication (Kokai) No. 2000-186918 (paragraphs 0034-0036, and FIGS. 3-5)

Patent Document 2: Japanese Patent Publication (Kokai) No. 2000-183001 (paragraphs 0033-0036, and FIGS. 1 and 9)

In the method of detecting the polishing terminal based on the spectra intensity distribution of light reflected from the polished surface of a wafer, it is necessary to precisely irradiate parallel beams onto a polished surface, and it is difficult to perform an optical adjustment. Further, in the method, when a polished surface is slightly inclined or an optical system has a slight aberration, regular reflection beams may generate an image outside a narrow beam-shielding slit. Accordingly, regular reflection beams passing through the beam-shielding slit are decreased, and an intensity of beams for detecting the polishing terminal is attenuated, thereby lowering detection sensitivity. Further, it is necessary to provide an irradiating and receiving optical system using a beam splitter for separating irradiating beams from reflected beams, thereby lowering beam efficiency.

In the method of detecting the polishing terminal by comparing a color component of light reflected from a polished surface of a wafer, the color sensor detects the color component of reflective beams without splitting. Accordingly, it is difficult to precisely analyze colors of RGB and accurately detect the polishing terminal.

In view of the above problems, the present invention has been developed, and an object of the present invention is to provide a method of evaluating a film thickness in which it is possible to accurately evaluate an actual thickness of a film during a polishing process.

Another object of the present invention is to provide a method of detecting the polishing terminal in which it is possible to accurately evaluate an actual thickness of a film during a polishing process and detect the polishing terminal.

A further object of the present invention is to provide a device-manufacturing apparatus capable of manufacturing a device while accurately evaluating a thickness of a film during a polishing process.

Further objects and advantages of the present invention will be apparent from the following description of the invention.

SUMMARY OF THE INVENTION

In order to attain the objects described above, according to the present invention, a method of evaluating a thickness of a film during a polishing process includes the steps of irradiating light onto a surface of the film during the polishing process; determining a differential signal of reflection spectra at a polishing time t and a polishing time t+$\Delta$t with a time difference $\Delta$t therebetween; and analyzing the differential signal to determine a thickness of the film at the polishing time t.

In the method of evaluating a film thickness, light is irradiated onto the surface of the film during the polishing process, and the differential signal of the reflection spectra from the film surface is determined at the polishing times with a specific time difference therebetween. Then, the differential signal is analyzed, so that the thickness of the film during the polishing process is determined. In the method, the differential signal of the reflection spectra is determined. Accordingly, it is possible to selectively obtain a specific component of reflective light with high intensity and low noise components during the polishing process, thereby making it possible to accurately evaluate the thickness of the film.

According to the present invention, a method of detecting a polishing terminal while evaluating a thickness of a film during a polishing process comprises the steps of irradiating light onto a surface of the film during the polishing process; determining a differential signal of reflection spectra at a polishing time t and a polishing time t+$\Delta$t with a time difference $\Delta$t therebetween; analyzing the differential signal to determine the thickness of the film at the polishing time t; and detecting the polishing terminal based on the thickness.

In the method of detecting the polishing terminal, light is irradiated onto the surface of the film during the polishing process, and the differential signal of the reflection spectra from the film surface at the polishing times with a specific time difference therebetween is analyzed, thereby making it possible to accurately evaluate the thickness of the film during the polishing process. Accordingly, it is possible to precisely detect the polishing terminal based on the thickness.

According to the present invention, a device-manufacturing apparatus capable of manufacturing a device through a film-polishing process comprises a polishing device for polishing a film; a reflection spectra measurement device for irradiating light onto a surface of a film during the polishing process and measuring reflection spectra at a polishing time t and a polishing time t+Δt with a time difference Δt therebetween; a differential-signal computing device for computing a differential signal of the reflection spectra; and a differential-signal analysis device for analyzing the differential signal and computing a thickness of the film at the polishing time t.

In the device-manufacturing apparatus of the present invention, the reflection spectra measurement device irradiates light onto the surface of the film during the polishing process, and measures the reflection spectra at the polishing time t and the polishing time t+Δt with the time difference Δt therebetween. The differential-signal computing device computes the differential signal of the reflection spectra. The differential-signal analysis device analyzes the differential signal and computes the thickness of the film at the polishing time t. Accordingly, it is possible to accurately evaluate the thickness of the film during the polishing process during manufacturing a device.

In the method of evaluating a film thickness, the differential signal of the reflection spectra is measured during the polishing process. Accordingly, it is possible to selectively obtain a specific component of reflective light with high intensity and low noise components during the polishing process, thereby making it possible to accurately evaluate the thickness of the film based on the differential signal. The film thickness accurately is evaluated during the polishing process, so that it is possible to detect the polishing terminal of the film with high precision. It is possible to manufacture a semiconductor device through the polishing process with high yield and throughput.

In the device-manufacturing apparatus of the present invention, the differential signal of the reflection spectra measured during the polishing process is analyzed. Accordingly, it is possible to apply a conventional spectra reflection factor measuring device capable of measuring a normal reflection factor without a complex optical system capable of detecting solely specific reflective light, thereby reducing cost of the apparatus and the device.

DETAILED DESCRIPTION OF PREFERRED EMBODIMENTS

Figure 1:
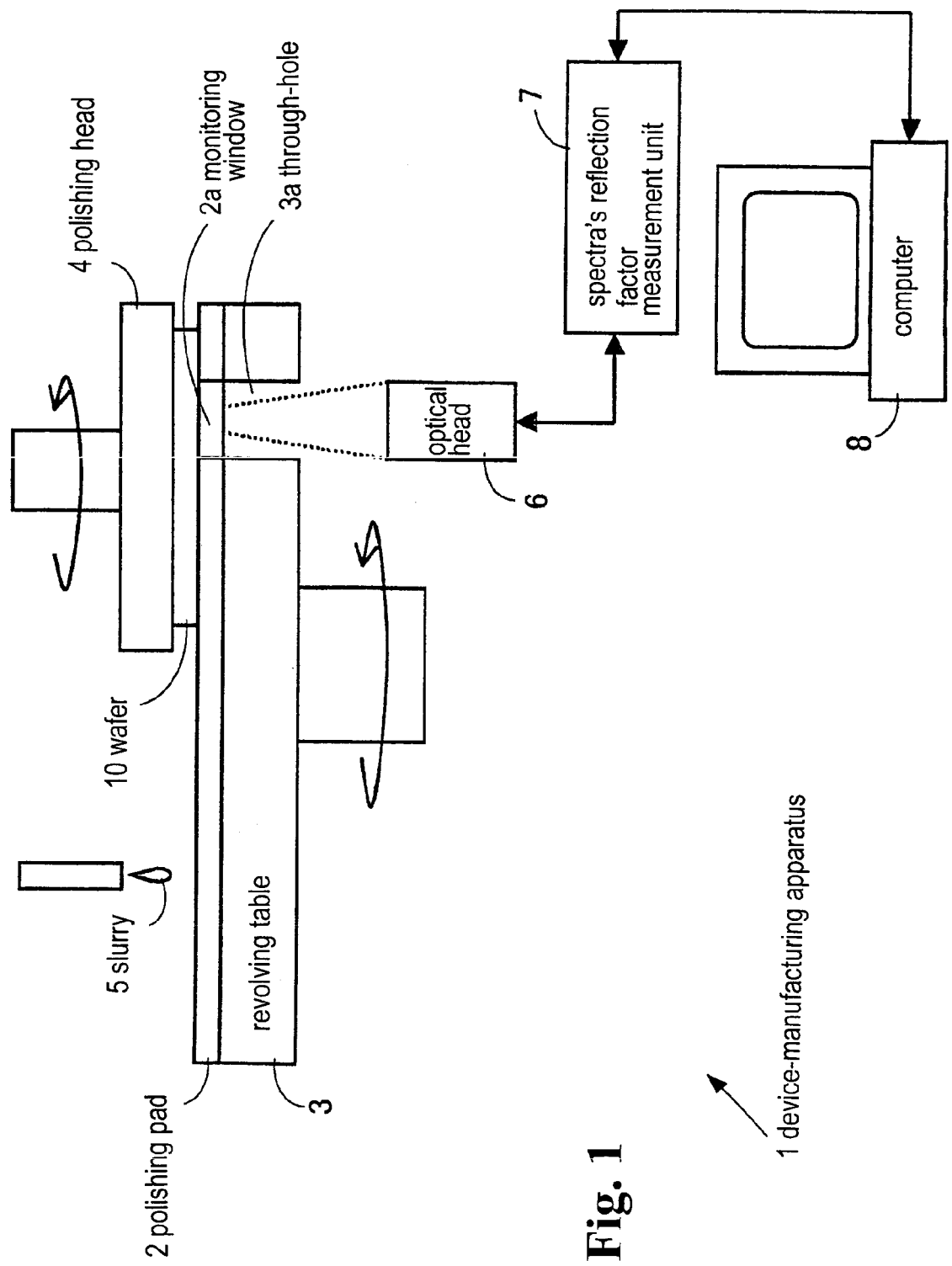
FIG. 1 is a schematic diagram showing a device-manufacturing apparatus according to an embodiment of the present invention.

Hereunder, embodiments of the present invention will be explained with reference to the accompanying drawings. In the embodiments, as an example, an insulating film formed on a wafer is polished during a manufacturing process of a semiconductor device. An optical model for evaluating a film thickness during a polishing process will be explained first.

A thickness of a thin film at a polishing time t is defined as d; a reflection factor of light comprising the wave number x in a medium at the polishing time t is defined as $R_1(x)$; a thickness of the thin film at a polishing time t−Δt with a relatively short period of time Δt from the polishing time t is defined as d+Δd; and a reflection factor of light comprising the wave number x in the medium at the polishing time t−Δt is defined as $R_0(x)$. The reflection factors $R_1(x)$ and $R_0(x)$ are individually expressed by optical models (1) and (2) as shown below:

$$R_1(x) = A \cdot \cos(4\pi dx) + B \quad (1)$$

$$R_0(x) = A \cdot \cos\{4\pi(d+\Delta d)x\} + B \quad (2)$$

where A and B correspond to proportional constants. When a wafer is polished during a manufacturing process of a semiconductor device, the proportional constant B is dependent on the wave number x. A variation of the proportional constant B is small relative to a change of the film thickness Δd during the polishing process. Accordingly, it is possible to eliminate the proportional constant B through a differential signal $R_1(x)-R_0(x)$ expressed by equation (3) as follows:

$$R_1(x) - R_0(x) = A[\cos(4\pi d\, x) - \cos\{4\pi(d+\Delta d)x\}] \quad (3)$$
$$= 2A \cdot \sin(2\pi \Delta d\, x) \cdot \sin\{2\pi(2d+\Delta d)x\}$$

In the optical model expressed by equation (3), a long periodic sin curve with one cycle of 1/Δd is superposed on a short periodic sin curve with one cycle of 1/(2d+Δd). Reflection factors of light having the wave number x are measured at the polishing time t and the polishing time t−Δt to obtain the differential signal $R_1(x)-R_0(x)$ of the reflection spectra. Accordingly, it is possible to determine a value of 2d+Δd from the short period sin wave, so that the film thickness d is obtained by subtracting Δd from 2d+Δd and multiplying by one-half (½).

As described above, through the optical model, it is possible to compute the film thickness d at the polishing time t by analyzing the differential signal $R_1(x)-R_0(x)$ between the reflection factor $R_1(x)$ at the polishing time t and the other reflection factor $R_0(x)$ at the polishing time t−Δt. It is possible to determine the change of the film thickness Δd during the polishing process from a product of a polishing rate and the time difference Δt. However, the polishing rate during the polishing process may have a variation, thereby causing an uncertain factor. There are two methods of minimizing an influence of a variation in the thickness change Δd on the film thickness d as follows.

The first method is to suppress a proportion of the thickness change Δd to the film thickness d to less than one-fifth. According to the first method, it is possible to suppress the influence of the variation in the thickness change Δd on the film thickness d to less than one-tenth. For example, when Δd/d is equal to ⅕ and the thickness change Δd has a variation of ±5%, it is possible to suppress the influence of the variation in the thickness change Δd on the film thickness d to ±0.5%.

In the second method, the polishing rate for calculating the thickness change Δd is not treated as a constant. Instead, a polishing rate of polishing a previous wafer is used for polishing the following wafer though feedback.

When the optical model described above is used for evaluating a thickness of a thin film, it is possible to obtain the following advantages. First, it is possible to eliminate an influence of light other than interfering components of the reflective beams. Second, it is possible to double an intensity of amplitude of the differential signal through selecting an optimum condition as compared with a single reflection spectrum.

In a non-circuitry area other than a circuit pattern of a wafer, reflective beams include interfering components according to the optical theory. On the other hand, in a circuit area with a complex circuit pattern formed with a poly-silicon film formation or a trench formation, scattered components are predominant. A response of the interfering components depends on a variation in the film thickness, thereby causing a rapid change in the spectra. A response of the scattered components does not greatly depend on a variation in the film thickness. Accordingly, when the differential signal $R_1(x)-R_0(x)$ is obtained in the relatively short time difference $\Delta t$ as described above, it is possible to selectively extract the interfering components.

When a polishing amount in the time differences $\Delta t$, i.e., the thickness change $\Delta d$, is optimized, phases of the reflection spectra with the reflection factors $R_1(x)$ and $R_0(x)$ are inverted with each other. Accordingly, it is possible to double the intensity of amplitude of the differential signal $R_1(x)-R_0(x)$ as compared with the single reflection spectrum with the reflection factor $R_1(x)$ or $R_0(x)$. In this case, it is necessary to set the wave number x with which the amplitude of the differential signal $R_1(x)-R_0(x)$ is maximized within a measurement range. When a refraction index of the thin film is n and the measurement range of wavelengths is $\lambda_1$ to $\lambda_2$, the prerequisite condition is given by the following expression 4A, or preferably expression 4B.

$$\Delta d \leq \lambda_2/(4n) \quad (4A)$$

$$\lambda_1/(4n) \leq \Delta d \leq \lambda_2/(4n) \quad (4B)$$

Figure 2:
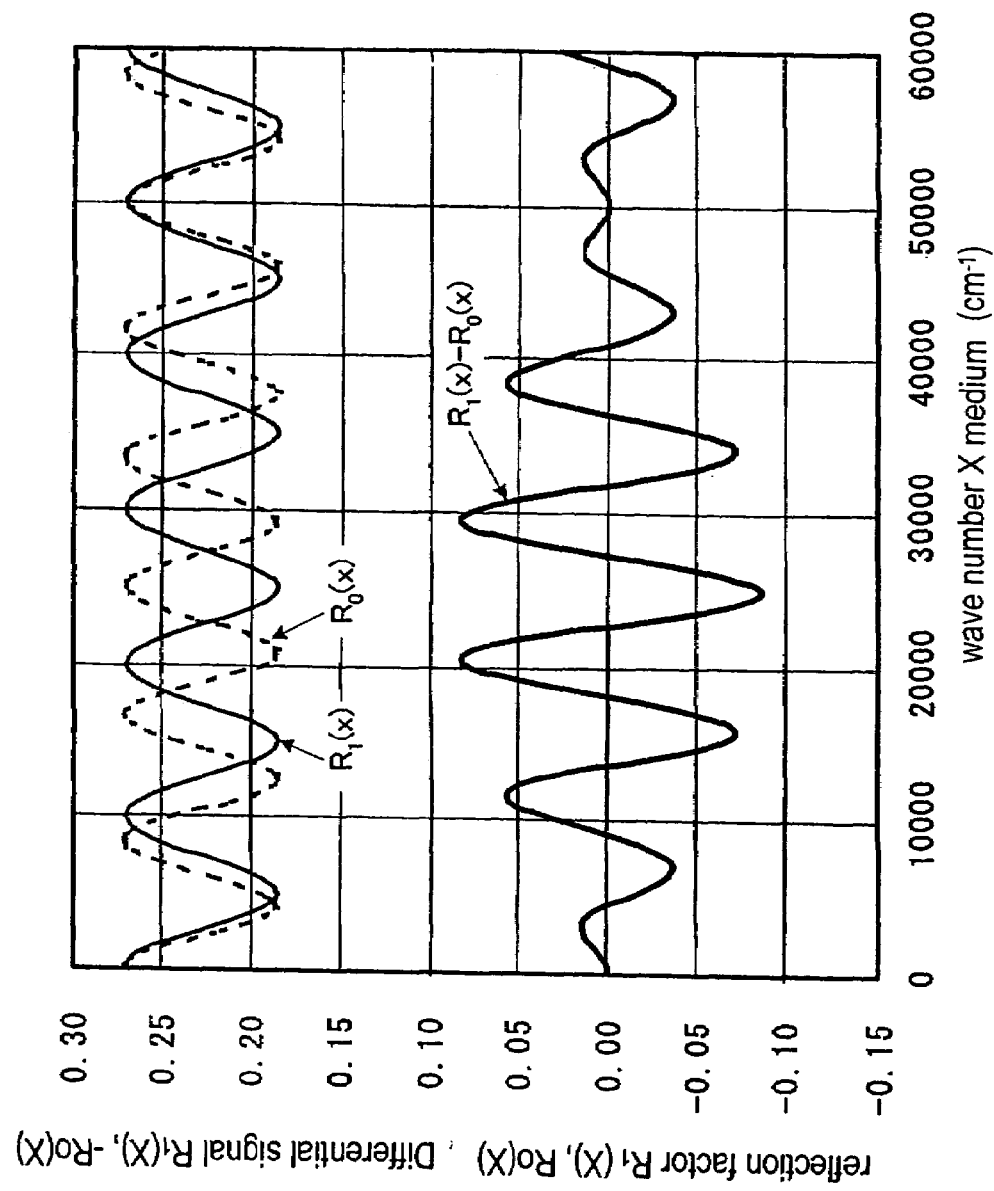
FIG. 2 is a chart showing a computation result base on an optical model.

FIG. 2 is a chart showing a computation result base on the optical model.

In the computation shown in FIG. 2, a thin $SiO_2$ film is formed on a silicone wafer, and the thin film is polished in accordance with the optical model. In FIG. 2, the horizontal axis represents the wave number x ($cm^{-1}$), and the vertical axis represents the reflection factors $R_1(x)$ and $R_0(x)$ and the differential signal $R_1(x)-R_0(x)$, wherein a dotted line represents the reflection factor $R_0(x)$, and solid lines represent the reflection factor $R_1(x)$ and the differential signal $R_1(x)-R_0(x)$.

In the computation, refraction indexes of individual layers are Si=4 and $SiO_2$=1.5, and a refraction index of water contained in slurry of a polishing agent is 1.33. For the sake of simplicity, wavelength dispersion related to the refraction indexes is ignored. A thickness d of the $SiO_2$ film and the thickness change $\Delta d$ (polished amount) are 500 nm and 100 nm, respectively.

As shown in FIG. 2, the amplitude of the differential signal $R_1(x)-R_0(x)$ is maximized at 25000 $cm^{-1}$ of the wave number x, where the absolute value of the amplitude becomes double of amplitude of the single spectrum with the reflection factors $R_1(x)$ or $R_0(x)$. Accordingly, in the polishing process of the $SiO_2$ film, the polishing amount is optimized and the differential signal $R_1(x)-R_0(x)$ is obtained from the reflection spectra within the measurement range of wavelengths before and after the polishing process, so that it is possible to precisely evaluate the film thickness through the optical model.

FIG. 1 is a schematic diagram showing a device-manufacturing apparatus according to an embodiment of the present invention. A device-manufacturing apparatus 1, i.e., a chemical-mechanical polishing (CMP) apparatus, includes a revolving table 3 having a polishing pad 2 on a front surface thereof and a revolving polishing head 4. In the polishing process, the polishing pad 2 is pressed against a wafer 10 on the polishing head 4 while slurry 5 is dripping onto the polishing pad 2. The revolving table 3 and the polishing head 4 rotate so as to polish a surface of the wafer 10. A monitoring window 2a formed of quartz is formed in the polishing pad 2 at a portion where the wafer 10 is placed during the polishing process. A through-hole 3a is formed in the revolving table 3 at a position corresponding to the monitoring window 2a.

An optical head 6 and a reflection-factor measuring unit 7 are disposed on a backside of the revolving table 3 as main components for measuring the reflection factor of the wafer 10, and face the monitoring window 2a formed in the polishing pad 2As. The optical head 6 is connected to the reflection-factor measuring unit 7, and the reflection-factor measuring unit 7 is linked to a computer 8. In the device-manufacturing apparatus 1, the computer 8 controls and stores various types of data related to the measurement of the reflection factor of the wafer 10.

In the device-manufacturing apparatus 1, a polishing device is formed of the polishing pad 2, the revolving table 3, and the polishing head 4. A reflection spectra measurement device is formed of the optical head 6, the reflection-factor measuring unit 7, and the computer 8. A differential-signal computing device and a differential-signal analysis device are formed of the computer 8.

The device-manufacturing apparatus 1 with the components described above is used for evaluating the thickness of the thin film formed on the surface of the wafer 10 during the polishing process. The method of evaluating a thickness of a thin film during a polishing process is specifically described below.

The device-manufacturing apparatus 1 was used for polishing an oxidized ($SiO_2$) film formed on the silicone wafer 10 with a diameter of six inches and an integrated circuit (IC). The IC formed on the wafer 10 was 3 mm square in size and had a trench MOS (metal oxide semiconductor) for power storage and a logic circuit. A thickness of the oxidized film in the non-circuitry area of the wafer 10 was measured to be 2445 nm using an optical thickness meter (NanoSpec 9100 manufactured by Nanometrics Co., Inc.) having a spot diameter size of 10 μm.

The wafer 10 was pasted on the polishing head 4 with a grinding surface, i.e., the oxidized film, facing an upper side so that the oxidized film faced the polishing pad 2. The polishing pad 2 was then pressed against the wafer 10. Next, while the slurry 5 was dripping, the polishing head 4 and the revolving table 3 were jointly rotated so as to polish the oxidized film of the wafer 10. The polishing conditions were as described below. The slurry 5 was prepared using SS-25, a product of Cabbot Co., Inc. A pressure of pressing the polishing head 4 against the polishing pad 2 was adjusted to 7.5 psi (517 hPa). A rotation speed of the revolving table 3 was adjusted to 90 rpm. From a previous polishing test, it was found that the oxidized film was ground at a polishing rate of approximately 750 nm per minute.

During the polishing process, the reflection factor was measured every full turn of the wafer 10 via the monitoring window 2a and the through-hole 3a. With the computer 8, the reflection-factor measuring unit 7, and the optical head 6, beams within a specific measurable range of wavelengths were irradiated onto the wafer 10, and the reflection factor was measured upon reception of the beams reflected from the wafer 10. A spot diameter of the beams irradiated onto the wafer 10 was approximately 10 mm, and a measurement position on the surface of the wafer 10 was arranged at a position 40 mm from the center of the wafer 10. A position in a θ-direction was randomly varied for each round.

The reflection-factor was measured a total of 183 times during the polishing process (approximately 2 minutes). The differential signal was obtained between each of reflection spectra obtained from the 11th round and that generated 10 rounds back. The interval was 10 rounds, since the polishing amount (the thickness change Δd) was set at 83 nm so that a peak of the differential signal was obtained in a range of 420 nm to 720 nm within the measurable wavelength range.

Figure 3:
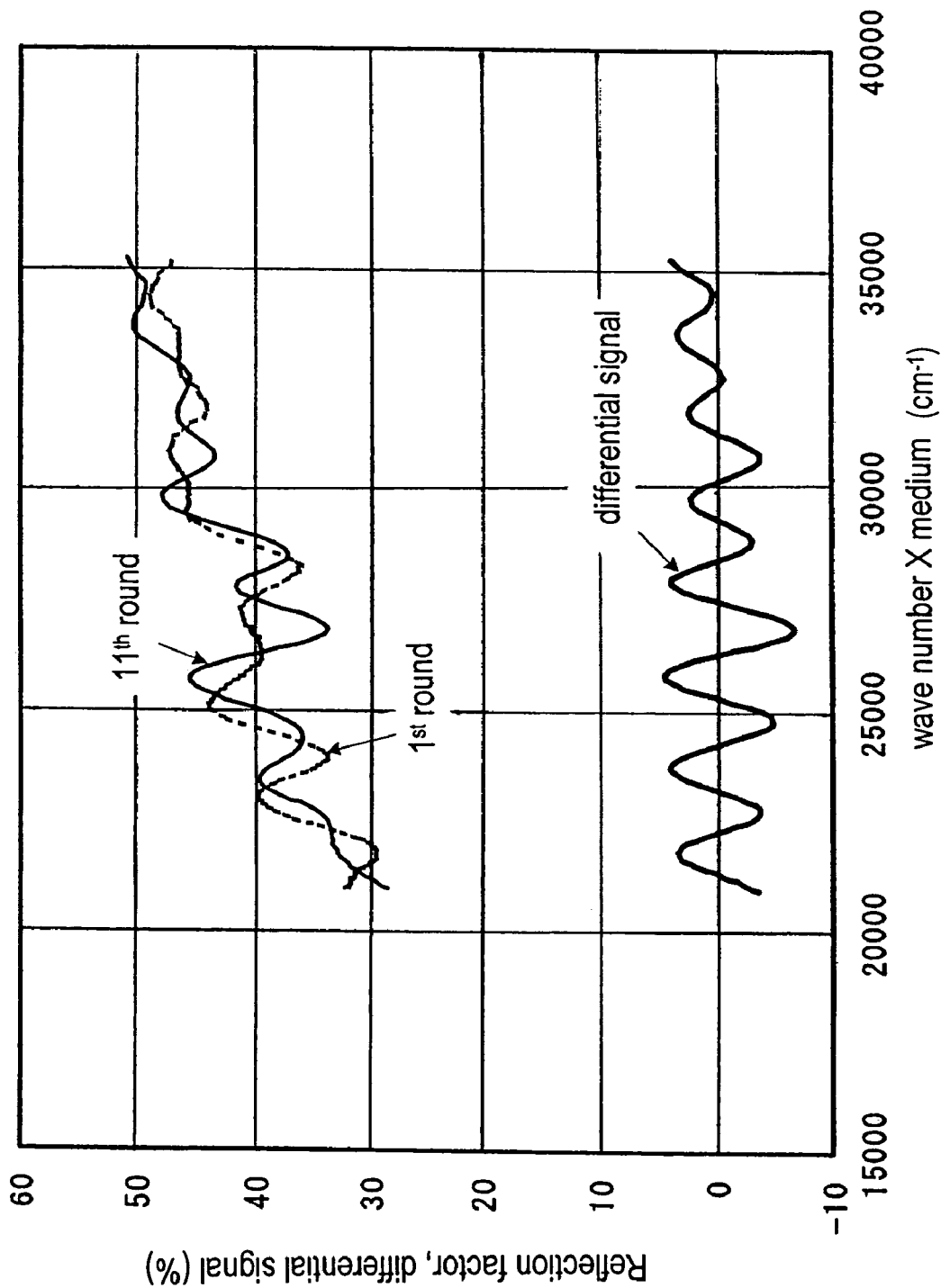
FIG. 3 is a chart showing an example of reflection spectra obtained via the device-manufacturing apparatus.
Figure 4:
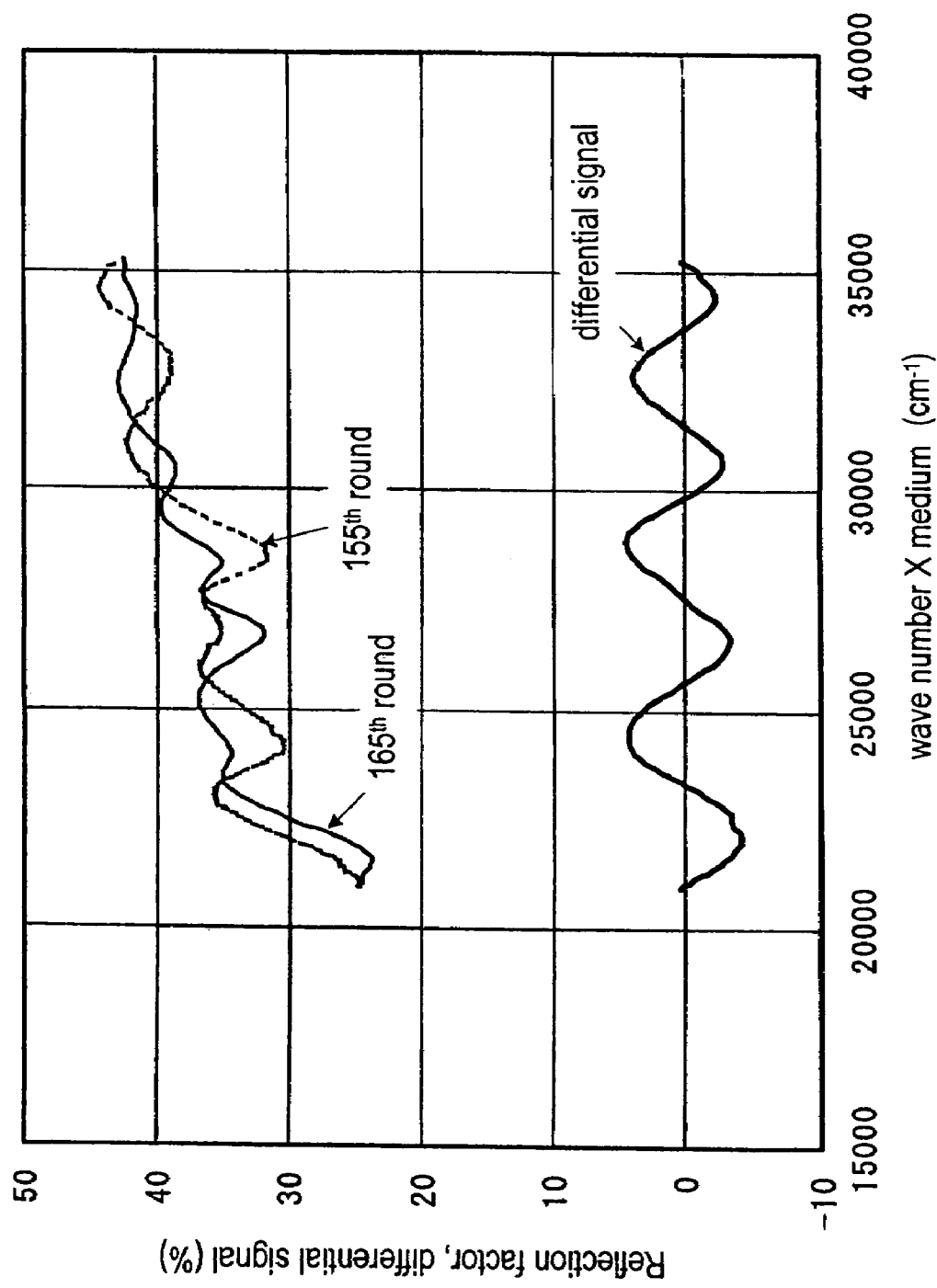
FIG. 4 is a chart showing another example of reflection spectra obtained via the device-manufacturing apparatus.

FIGS. 3 and 4 are charts showing examples of reflection spectra obtained via the device-manufacturing apparatus 1. In FIGS. 3 and 4, the horizontal axis represents the wave number ($cm^{-1}$) in the medium and the vertical axis represents the reflection factor (%) and the differential signal (%) thereof. In FIG. 3, the dotted lines represent reflection spectra generated in the first round of the measurement of the reflection factor, whereas the solid lines represent reflection spectra generated in the 11th round of the measurement of the reflection factor and the differential signals thereof. In FIG. 4, the dotted lines represent reflection spectra generated in the 155th round of the measurement of the reflection factor, whereas the solid lines represent the reflection spectra generated in the 165th round of the measurement of the reflection factor and the differential signal thereof.

As shown in FIGS. 3 and 4, there is large influence of noise components in the single reflection spectra of the first round and the 11th round of the measurement of the reflection factor, thereby making it difficult to accurately measure the thickness of the oxidized film on the surface of the wafer 10 based on the reflection spectra. On the other hand, as shown in FIGS. 3 and 4, there is small influence of the noise components in the differential signals between the first round and the 11th round, and the 155th round and 165th round of the measurement of the reflection factor, thereby making it possible to clearly obtain the amplitude of the interfering components of the reflected beams. Further, as described in the optical model, the amplitude of the differential signals is doubled as compared with that of the single reflection spectra.

As shown in FIGS. 3 and 4, the short cycle is obtained from the differential signals, so that it is possible to determine the thickness of the oxidized film. The cycle can be obtained by dividing the wave number (x) within the specific interval of the wave number by the specific interval. The process is simple, and the cycle can be computed within a measurable cycle of the reflection factor via the computer 8.

Figure 5:
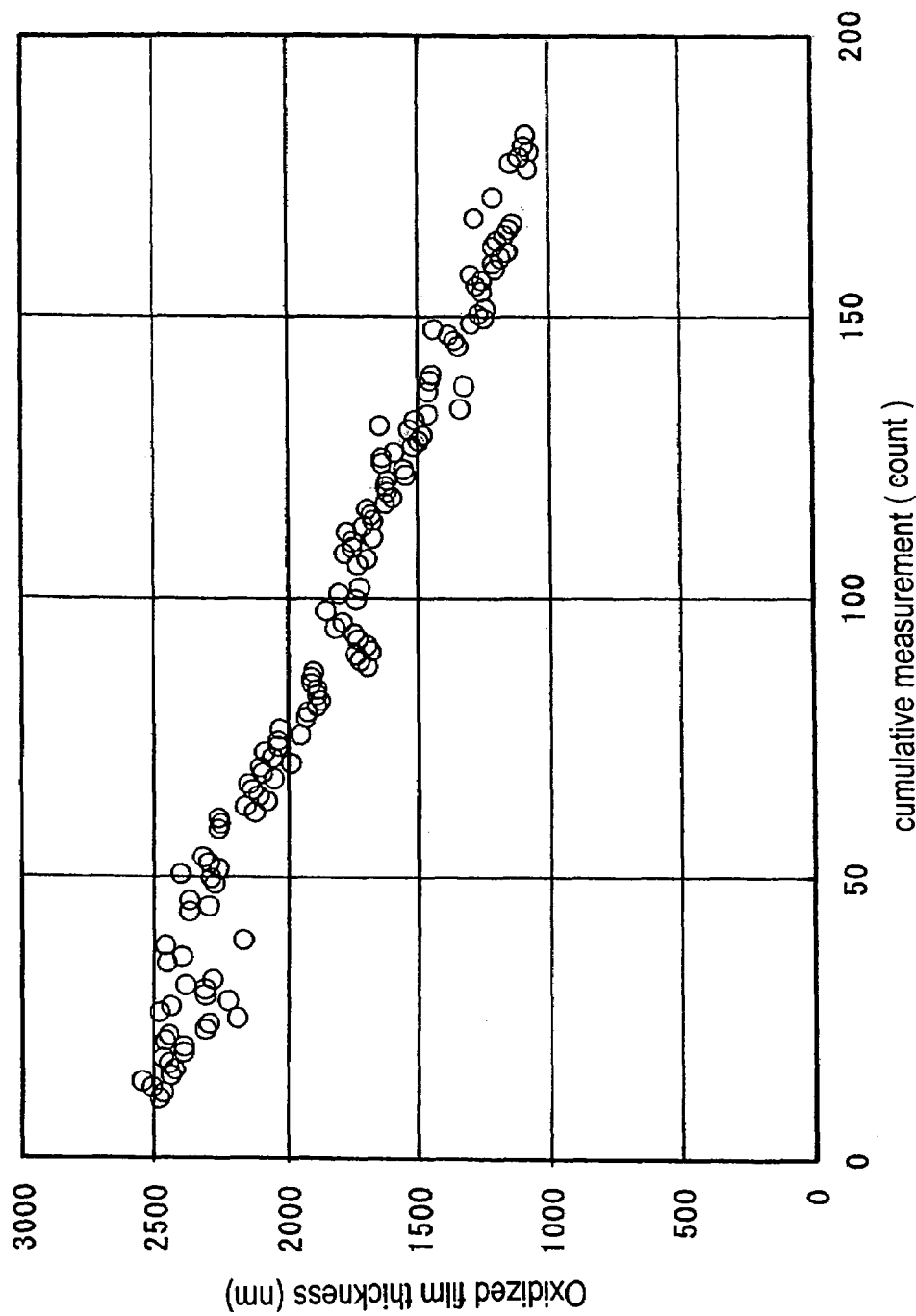
FIG. 5 is a chart showing a relationship between a cumulative measurement count and a thickness of an oxidized film.

FIG. 5 is a chart showing a relationship between a cumulative measurement count and the thickness of the oxidized film. In FIG. 5, the horizontal axis represents the cumulative measurement count of the reflection factor (or cumulative polishing count), whereas the vertical axis represents the thickness (nm) of the oxidized film. The thickness of the oxidized film is determined from the cycle of the differential signals of the reflection spectra obtained at an interval of 10 rounds, and is plotted against the number of the cumulative measurement count.

As shown in FIG. 5, the thickness of the oxidized film is reduced linearly with the cumulative measurement count. In other words, the device-manufacturing apparatus 1 evaluates and monitors the thickness of the oxidized film of the wafer 10 with high precision during the polishing process. After the polishing process, the thickness of the polished oxidized film in the non-circuitry area of the wafer 10 was measured using the optical film thickness meter. The oxidized film has a thickness of 1043 nm in good agreement with the thickness of the oxidized film at the polishing terminal shown in FIG. 5.

As described above, according to the method of evaluating a film thickness, it is possible to precisely measure the thickness of the oxidized film formed on the wafer 10 during the polishing process on a real-time basis. Further, when the method of evaluating a film thickness is applied to detect the polishing terminal, it is possible to control the thickness of the oxidized film with high precision.

In order to accurately measure the reflection factor for evaluating the thickness or to detect the polishing terminal of the oxidized film formed on the wafer 10, it is necessary to equally irradiate the beams on both the circuitry area and the non-circuitry area of the wafer 10. Accordingly, it is necessary to irradiate the beams in a spot size greater than a size of an IC chip formed from the wafer 10.

In the embodiment, the oxidized film has a thickness of approximately 1 μm after the polishing process that is relatively thick for a general semiconductor device. The method is also effective for a film thickness of less than 1 μm.

As shown in the results of the measurement in FIGS. 3 and 4, when the film thickness decreases, the cycle of the amplitude of the differential signal gradually increases. Accordingly, when the measurement wavelength range does not have a maximum value and a minimum value, it is difficult to properly evaluate the film thickness. For example, when an object of measurement of the reflection factor for evaluating the film thickness has a refraction index of 1.5, and the measurement wavelength range is between 420 nm and 720 nm, it is difficult to evaluate an oxidized film with approximately 170 nm in thickness or less. Accordingly, the method is effective for evaluating a film thickness and detecting the polishing terminal of an oxidized film having a refraction index of 1.5 and a minimum film thickness of 170 nm.

As described above, in the present invention, the method of evaluating a film thickness includes the steps of irradiating the beams within a specific measurement wavelength range onto an oxidized film during the polishing process; measuring the reflection factor of reflective beams to obtain reflection spectra; obtaining the differential signal of the reflection spectra at a proper time interval (or at a proper interval of the polishing count or the measurement count of the reflection factor); analyzing the differential signal so as to evaluate the film thickness. By using the differential signal, it is possible to suppress scattered components of the reflected beams so as to obtain highly intense, low-noise interfering components. Accordingly, it is possible to evaluate the thickness of the oxidized film with high precision during the polishing process.

Further, in the method, it is possible to detect the polishing terminal with high precision through evaluating the film thickness. As a result, it is possible to manufacture a semiconductor device with high yield and throughput.

In the present invention, the device-manufacturing apparatus for evaluating the film thickness and detecting the polishing terminal includes a general apparatus for measuring a reflection factor of spectra. Accordingly, it is not necessary to provide a complex optical system capable of detecting solely normal reflection beams, thereby reducing cost of the manufacturing apparatus and products.

In the present invention, the methods of evaluating the film thickness and detecting the polishing terminal of an oxidized thin film are applicable during a polishing process of a wide variety of films as well as the thin film normally in the production of semiconductor devices. Further, in addition to the production of semiconductor devices, the device-manufacturing apparatus is applicable to evaluation of a film thickness of a variety of films and detection of the polishing terminal during the polishing process.

The disclosure of Japanese Patent Application No. 2004-053947, filed on Feb. 27, 2004, is incorporated in the application.

While the invention has been explained with reference to the specific embodiments of the invention, the explanation is illustrative and the invention is limited only by the appended claims.

What is claimed is:

1. A method of evaluating a thickness of a film during a polishing process, comprising:
    irradiating light for providing spectra onto a surface of the film during the polishing process,
    obtaining a differential signal of reflection spectra at a polishing time t and a polishing time t−Δt with a time difference Δt therebetween to obtain a specific component of reflective light with high intensity and low noise components, and
    analyzing the differential signal of the reflection spectra to obtain a thickness d of the film at the polishing time t.

2. A method according to claim 1, wherein in the step of analyzing the differential signal, a cycle of the differential signal is determined so that the thickness d is obtained from the cycle.

3. A method according to claim 1, wherein in the step of analyzing the differential signal, a thickness change Δd of the film in the time difference Δt is set to have a proportion Δd/d relative to the thickness d less than one-fifth so that the differential signal is analyzed by using the thickness change Δd to obtain the thickness d.

4. A method according to claim 1, wherein in the step of analyzing the differential signal, a thickness change Δd of the film in the time difference Δt is obtained as a product of the time difference Δt and a known polishing rate so that the differential signal is analyzed by using the thickness change Δd to obtain the thickness d.

5. A method according to claim 1, wherein in the step of analyzing the differential signal, a thickness change Δd of the film in the time difference Δt is set to be $\Delta d = \lambda_2/(4n)$ or a range of $\lambda_1/(4n) \leq \Delta d \leq \lambda_2/(4n)$, wherein n is a refraction index of the film and a measurement range of the reflection spectra is between $\lambda_1$ and $\lambda_2$, so that the differential signal is analyzed by using the thickness change Δd to obtain the thickness d.

6. A method according to claim 1, wherein in the step of obtaining the differential signal of the reflection spectra, said reflection spectra are expressed by an optical model with a wave number dependency and the differential signal is obtained from a differential component of the reflection spectra so that the differential signal does not have the wave number dependency.

7. A method according to claim 1, wherein the film is formed on a wafer for producing a plurality of chips, and in the step of irradiating light, the light has a spot size greater than a size of the chips.

8. A method of detecting a polishing terminal during a polishing process of a film, comprising:
    irradiating light for providing spectra onto a surface of the film during the polishing process,
    obtaining a differential signal of reflection spectra at a polishing time t and a polishing time t−Δt with a time difference Δt therebetween to obtain a specific component of reflective light with high intensity and low noise components,
    analyzing the differential signal of the reflection spectra to obtain a thickness of the film at the polishing time t, and
    determining the polishing terminal based on the thickness.

9. A method according to claim 1, wherein the light to be irradiated contains multiple spectra.

10. A method according to claim 9, wherein the light to be irradiated is a continuous light.

* * * * *